United States Patent
Park

(10) Patent No.: US 6,563,135 B2
(45) Date of Patent: May 13, 2003

(54) THIN FILM TRANSISTOR AND A METHOD OF FORMING THE SAME

(75) Inventor: Jae-Deok Park, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/882,031

(22) Filed: Jun. 18, 2001

(65) Prior Publication Data

US 2001/0028058 A1 Oct. 11, 2001

Related U.S. Application Data

(63) Continuation of application No. 08/859,688, filed on May 21, 1997.

(30) Foreign Application Priority Data

Jun. 21, 1996 (KR) .............................................. 96-22713

(51) Int. Cl.⁷ ....................... H01L 29/04; H01L 31/036; H01L 31/0376; H01L 31/20
(52) U.S. Cl. .......................................... 257/72; 257/59
(58) Field of Search .............................. 257/57, 59, 61, 257/66, 72, 336, 344, 408; 438/163, 149, 151, 157, 166, 30; 349/39, 42, 47, 139, 43

(56) References Cited

U.S. PATENT DOCUMENTS

| | | | |
|---|---|---|---|
| 5,238,861 A | * | 8/1993 | Morin et al. ................. 438/158 |
| 5,650,636 A | | 7/1997 | Takemura et al. ............. 257/59 |
| 5,658,808 A | | 8/1997 | Lin ............................. 438/155 |
| 5,729,308 A | * | 3/1998 | Yamazaki et al. ............. 349/39 |
| 5,903,249 A | | 5/1999 | Koyama et al. .............. 345/92 |

FOREIGN PATENT DOCUMENTS

JP 8-64838 * 3/1996 ......... H01L/29/786

* cited by examiner

*Primary Examiner*—Shouxiang Hu
(74) *Attorney, Agent, or Firm*—Birch, Stewart, Kolasch & Birch, LLP

(57) ABSTRACT

The thin film transistor includes an insulating substrate, and an active region formed on the insulating substrate. The active region includes a channel region, a source region formed on a first side of the channel region, a drain region formed on a second side of the channel region, a sub-channel region formed between the channel region and at least one of the source region and the drain region, and a first region formed between the channel region and each sub-channel region. The thin film transistor also includes an insulating layer formed on the channel region and each sub-channel region, a gate electrode formed on the insulating layer over the channel region, and a sub-gate electrode formed on the insulating layer over each sub-channel region. When impurities are implanted therein, the first region forms a lightly doped region; otherwise, each first region forms an offset region. During the doping of the source and drain regions with high concentration impurity ions, an implantation mask is formed over at least a portion of the gate electrode, at least a portion of each sub-gate electrode, and each first region. Accordingly, the width of each sub-gate electrode provides a margin of error when aligning the deposition of the mask.

9 Claims, 6 Drawing Sheets

THIN FILM TRANSISTOR AND A METHOD OF FORMING THE SAME

This application is a continuation application Ser. No. 08/859,688, filed on May 21, 1997, the entire contents of which are hereby incorporated by reference and for which priority is claimed under 35 U.S.C. §120; and this application claims priority of Application No. 96-22713 filed in Korea on Jun. 21, 1996 under 35 U.S.C. §119.

BACKGROUND OF THE INVENTION

1. Field of the Invention

The present invention relates to a thin film transistor and a method of forming the same, and more particularly, to a lightly doped drain (LDD) or offset structure of a thin film transistor providing enhanced performance by uniformly forming an LDD region or offset region.

2. Description of Related Art

To date, amorphous silicon thin film transistors constitute a main component of a conventional active matrix liquid crystal display (AMLCD). Compared to amorphous silicon, polysilicon has higher mobility, and, if used in a liquid crystal display, does not require a separate drive circuit. Instead, the drive circuit can be formed internally.

A recently developed polysilicon thin film transistor liquid crystal display includes a drive circuit and pixel array formed together on a transparent glass substrate. The thin film transistors of the drive circuit allow high frequency switching due to the use of polysilicon. However, thin film transistors used for pixel switching in a pixel array interfere with the switching of the thin film transistors in the drive circuit because the high drain current generated during an off state of the pixel switching transistors. In order to lower this off current to a predetermined level, thin film transistors incorporating an LDD structure, offset structure, and a dual gate structure have been suggested.

FIG. 1 shows a plan view of a portion of a pixel in a conventional liquid crystal display which uses a thin film transistor as a pixel switching element. FIG. 2 shows a cross-sectional view of the conventional liquid crystal display, taken along line II—II of FIG. 1.

As shown in FIG. 1, a signal line 13' and a data line 18' cross each other on an insulating substrate 10. The gate electrode 13 of a thin film transistor extends from the signal line 13', and the source electrode 18 of the thin film transistor extends from the data line 18'. The drain electrode 19 of the thin film transistor, which faces the source electrode 18, is connected to a pixel electrode 21. A first storage capacitor electrode 24 crosses over data line 18'. The pixel electrode 21, formed of a transferring conductive material on the first storage capacitor electrode 24, functions as a second storage capacitor electrode.

As shown in FIG. 2, a semiconductor active layer 11 is formed on an insulating substrate 10. The semiconductor active layer 11 is made of a polysilicon thin film. On the sides of the semiconductor active layer 11, high concentration impurity source and drain regions 11a and 11b are formed. Between the source and drain regions 11a and 11b, a channel region 11c is established. Between the source region 11a and the channel region 11c and between the drain region 11b and the channel region 11c, low concentration impurity LDD regions 16 are formed. On the channel region 11c, a gate insulating layer 12 and a gate electrode 13 are formed. Over the gate electrode 13, an insulating inter-layer 17 having a plurality of contact holes is formed. The source electrode 18 and the drain electrode 19 respectively contact the source region 11a and the drain region 11b through the contact holes formed in the insulating inter-layer 17. On the insulating inter-layer 17, a protective layer 20 is formed, and defines a contact hole through which a pixel electrode 21 contacts the drain electrode 19.

FIGS. 3A–3D show cross-sectional views taken along line III—III of FIG. 1 for illustrating a conventional method of manufacturing the conventional LDD structure of a thin film transistor.

As shown in FIG. 3A, polysilicon is formed on the insulating substrate 10, and patterned to form the semiconductor active layer 11. On the semiconductor active layer 11 and the exposed substrate 10, a first insulating layer and a first conductive layer are sequentially formed. The first conductive layer is a metal material or an impurity doped polysilicon type of conductive material. The first insulating layer and the first conductive layer are patterned according to a prescribed shape to form the gate insulating layer 12 and the gate electrode 13. At the same time, the signal line 13', connected to the gate electrode 13, and the first storage capacitor electrode 24 are formed (see FIG. 1).

As shown in FIG. 3B, photoresist is deposited (e.g., coated) over the substrate 10, and patterned to form an ion injection or implantation mask 15. Using the mask 15, high concentration impurity ions are injected by ion implantation or doping into the exposed semiconductor active layer 11 to form the source region 11a and the drain region 11b. Thereafter, heat treatment or annealing, using a laser, is performed to planarize the semiconductor active layer 11. The mask 15 is completely removed thereafter.

As shown in FIG. 3C, using the gate electrode 13 as a mask, low concentration conductive type ions are implanted into the semiconductor active layer 11 to form the LDD regions 16 adjacent to the source region 11a and the drain region 11b. As a result, the semiconductor active layer 11 includes the source region 11a, LDD region 16, channel region 11c, LDD region 16, and drain region 11b.

As shown in FIG. 3D, a second insulating layer, such as oxide material, is formed over the substrate 10 and patterned to form the insulating inter-layer 17. Through the insulating inter-layer 17, contact holes are formed to expose a portion of the source region 11a and a portion of the drain region lib. On the insulating inter-layer 17 and the contact holes, a second conductive material is deposited and patterned to form the source electrode 18 and the drain electrode 19 respectively connected to the source region 11a and the drain region 11b through respective contact holes.

Thereafter, a shown in FIG. 2, a third insulating layer is deposited and patterned to form the protective layer 20. Through the protective layer 20, a contact hole is formed to expose a portion of the drain electrode 19. On the protective layer 20, a third conductive material is deposited and patterned to form the pixel electrode 21. The pixel electrode 21 contacts the drain electrode 19 through the contact hole in the protective layer 20.

As described above, forming the conventional LDD structure of a polycrystaline silicon transistor requires the use of photoresist as an ion injection mask to form the LDD regions. That is, over the insulating substrate 10, having the semiconductor active layer 11 and the gate electrode 13, photoresist is coated over the insulating substrate 10 and etched using a mask corresponding to an LDD pattern to be formed later in order to form an ion injection mask. However, use of such a mask results in misalignment and over-etching of the LDD region. As a result, the conventional method of manufacturing an LDD structure of a thin film transistor has problems of accurately and uniformly establishing LDD regions. If the LDD regions are not accurately formed, the thin film transistors will not be uniformly formed, the picture quality uniformity deteriorates, the contrast ratio decreases, and the flicker phenomenon occurs.

SUMMARY OF THE INVENTION

Accordingly, it is an object of the present invention to provide an improvement in transistor structure which overcomes the above-described and other problems encountered in related and conventional thin film transistors.

Another object of the present invention is to provide a thin film transistor having uniformly sized LDD regions.

To achieve the above and other objects of the present invention, a thin film transistor comprising: a first insulating layer; an active region formed on the first insulating layer, the active region including a channel region, a source region formed on a first side of the channel region, a drain region formed on a second side of the channel region, a sub-channel region formed between the channel region and at least one of the source region and the drain region, and a first region formed between the channel region and each sub-channel region; a gate insulating layer formed on the channel region and each sub-channel region; a gate electrode formed on the gate insulating layer over the channel region; and a sub-gate electrode formed on the gate insulating layer over each sub-channel region.

These and other objects are further achieved by a method of forming a thin film transistor, comprising: forming an active region on a first insulating layer having a channel region, at least one sub-channel region, and first regions disposed between said channel region and each sub-channel region; sequentially forming a second insulating layer and a first conductive layer over said first insulating layer; patterning said second insulating layer and said first conductive layer to form a gate insulating layer and gate electrode on a channel region of said active layer, and to form a sub-gate insulating layer and associated sub-gate electrode on each sub-channel region of said active layer; forming a mask covering at least a portion of said gate electrode, at least a portion of each sub-gate electrode, and each first region of said active region; implanting impurities into exposed portions of said active region using said mask to form a source region on a first side of said channel region and a drain region on a second side of said channel region such that each sub-gate region is disposed between said channel region and one of said drain region and said source region.

Other objects and further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitative of the present invention, and wherein.

DETAILED DESCRIPTION OF THE PREFERRED EMBODIMENTS

Figure 1:
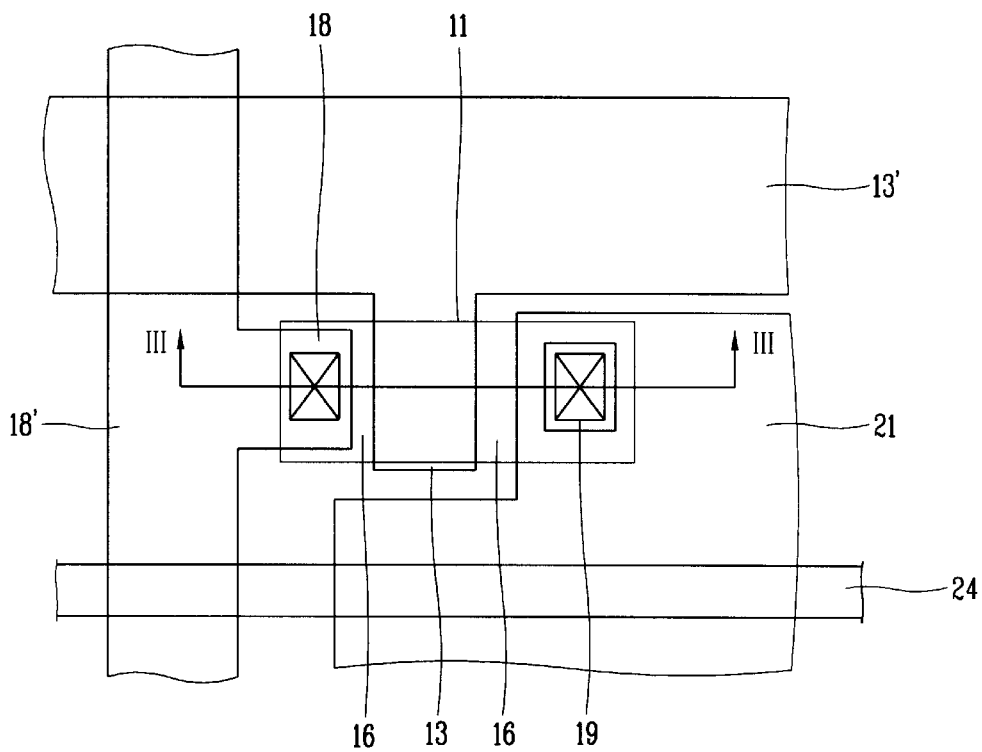
FIG. 1 shows a plan view of a conventional liquid crystal display which uses a thin film transistor as a pixel switching circuit.
Figure 2:
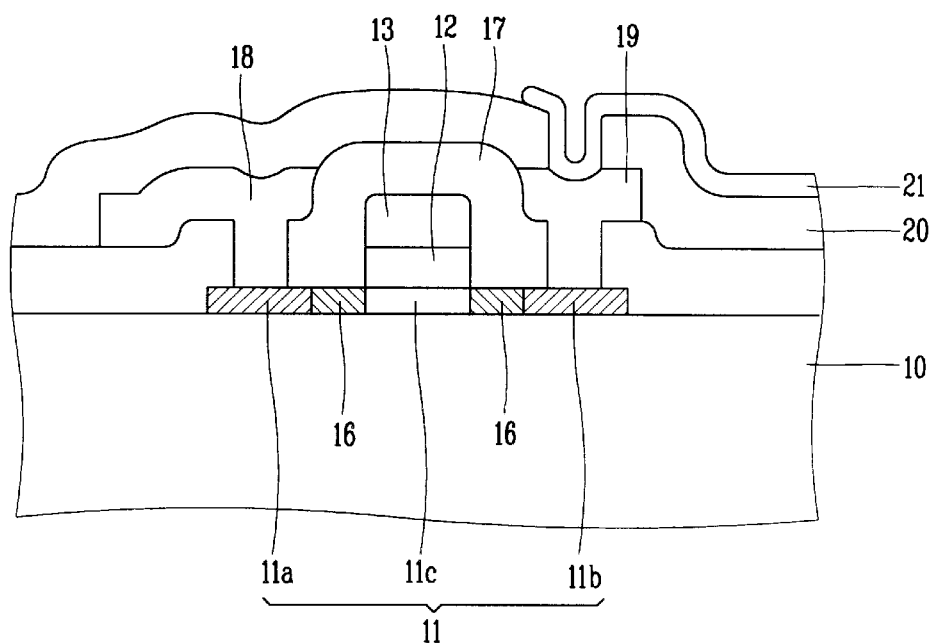
FIG. 2 shows a cross-sectional view taken along line II—II of FIG. 1.
Figure 3A:
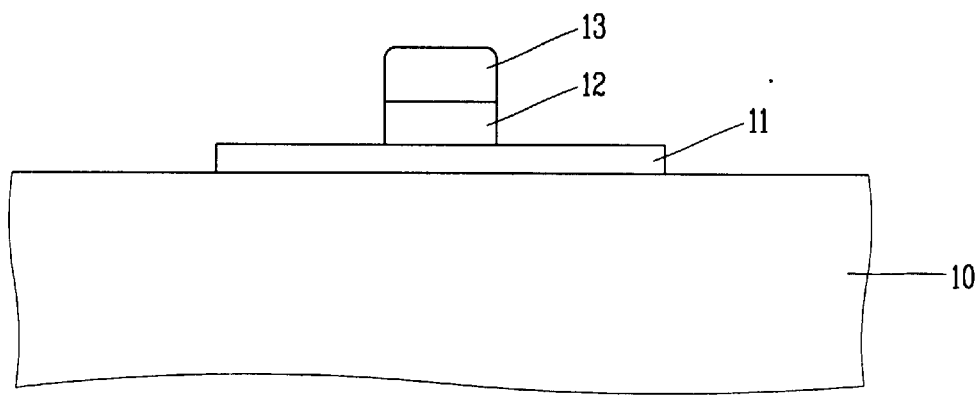
FIGS. 3A–3D show cross-sectional views taken along line III—III of FIG. 1 for illustrating a conventional method of forming the LCD of FIG. 1.
Figure 3B:
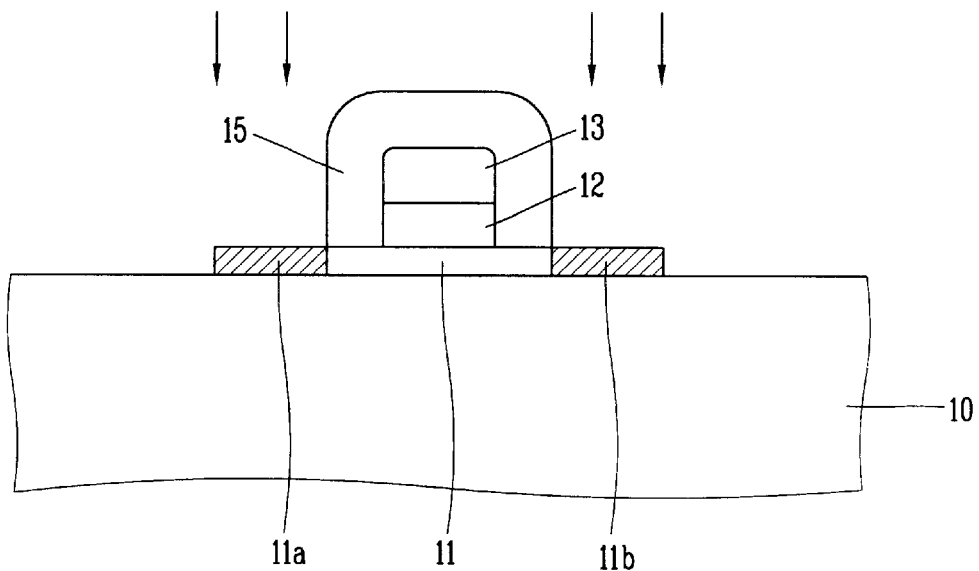
Figure 3C:
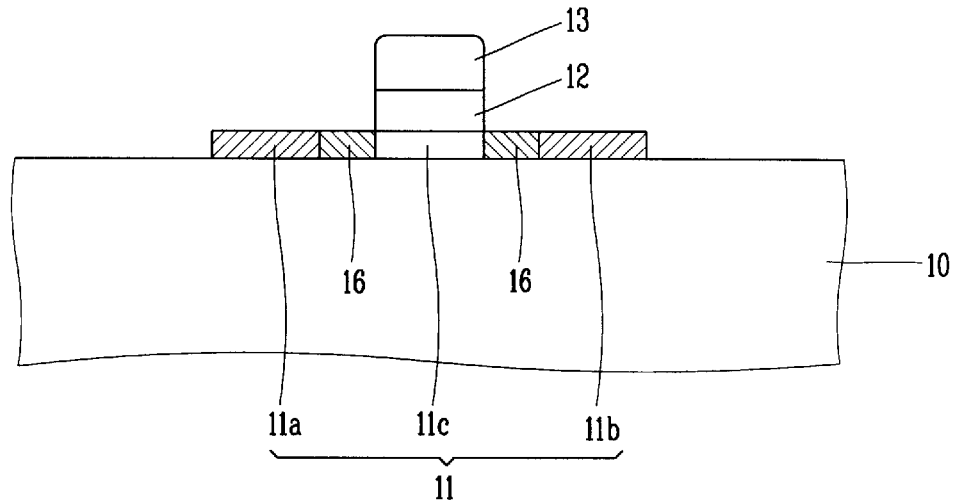
Figure 3D:
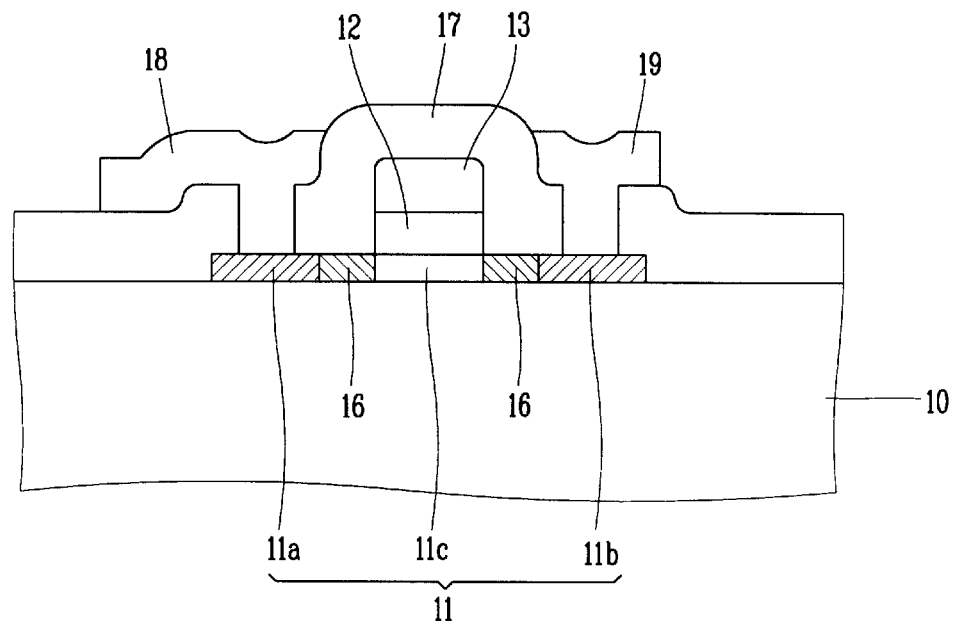
Figure 4:
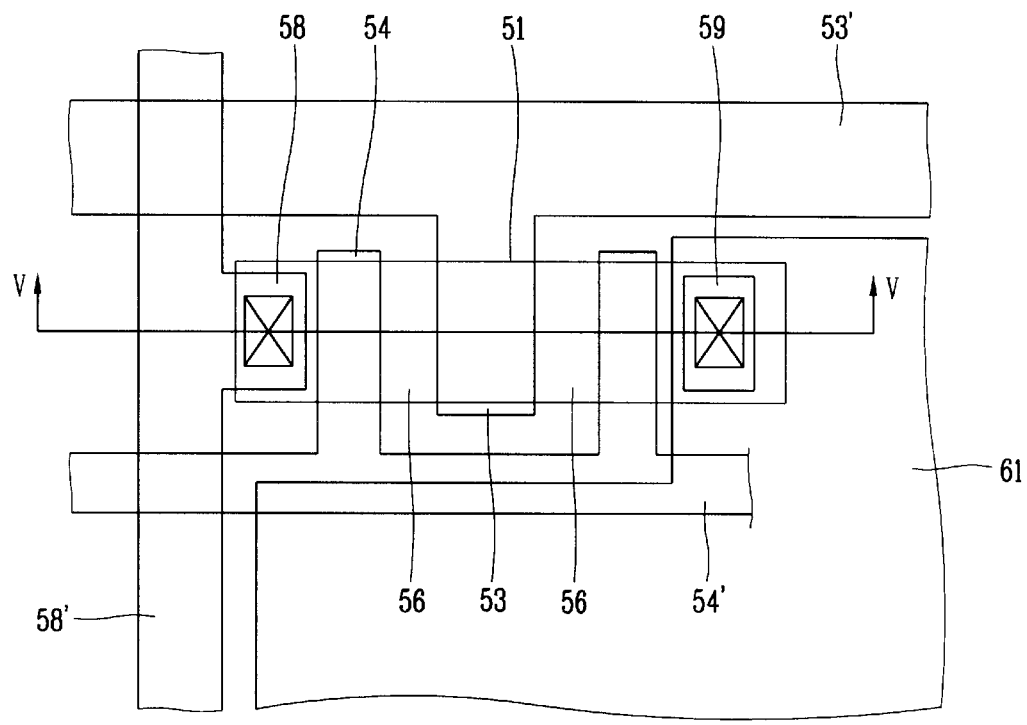
FIG. 4 shows a plan view of a liquid crystal display which uses a thin film transistor as a pixel switching circuit in accordance with the embodiments of the present invention.
Figure 5:
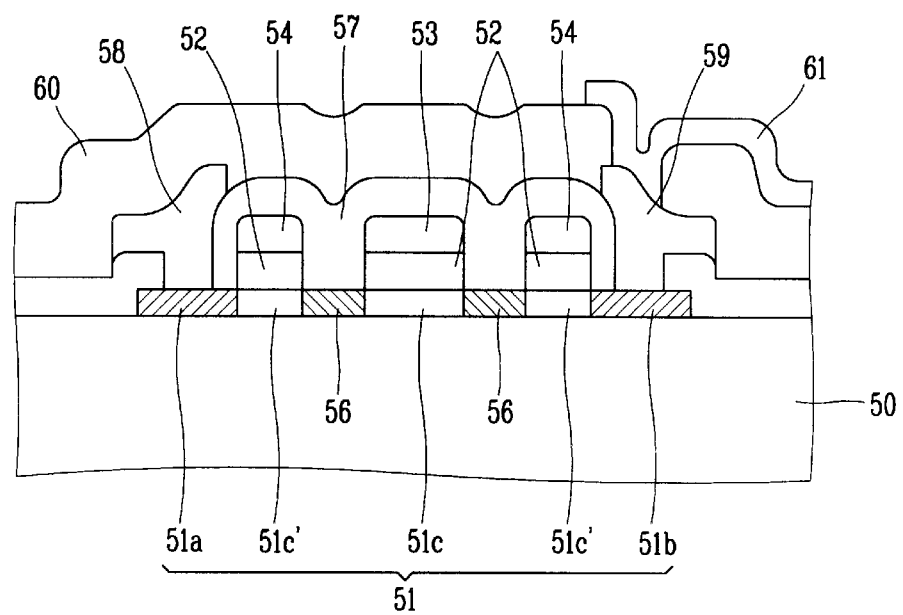
FIG. 5 shows a cross-sectional view taken along line V—V of FIG. 4.

Referring now in detail to the drawings for the purpose of illustrating the preferred embodiments of the present invention, FIG. 4 shows a liquid crystal display having a thin film transistor, and FIG. 5 shows a cross-sectional view taken along line V—V in FIG. 4.

As shown in FIG. 4, a signal line 53' and a data line 58' cross each other on an insulating substrate 50 (see FIG. 5). The gate electrode 53 of a thin film transistor extends from the signal line 53', and the source electrode 58 of the thin film transistor extends from the data line 58'. On both sides of the gate electrode 53, sub-gate electrodes 54 are formed. The sub-gate electrodes 54 are separated from each other by a predetermined distance. Therefore, a plurality of gate electrodes are formed in the present invention.

The sub-gate electrodes 54 are connected to a first storage capacitor electrode 54' which crosses over the data line 58'. On the first storage capacitor electrode 54', a pixel electrode 61, made of a transparent conductive material, is formed. The pixel electrode 61 connects with the drain electrode 59. The pixel electrode 61 also functions as a second storage capacitor electrode and together with the first storage capacitor electrode 54' forms a storage capacitor.

As shown in FIG. 5, a semiconductor active layer 51, made of a polysilicon thin film, is formed on an insulating substrate 50. On both sides of the semiconductor active layer 51, high concentration impurity source region 51a and drain region 51b are formed. On an inner side of each of the source region 51a and the drain region 51b, sub-channel regions 51c' are formed. Between the channel region 51c and the sub-channel region 51c', low concentration impurity LDD regions 56 are formed.

On the channel region 51c, a gate insulating layer 52 and a gate electrode 53 are formed. On each of the sub-channel regions 51c', the gate insulating layer 52 and the sub-gate electrode 54 are formed.

On the gate electrode 53 and the sub-gate electrodes 54, an insulating inter-layer 57 is formed and patterned to define contact holes. Through these contact holes, the source electrode 58 and the drain electrode 59 respectively contact the source region 51a and the drain region 51b. And a protective layer 60 is formed over the insulating substrate 50 and patterned to define a contact hole. Through the contact hole formed in the protective layer 60, a pixel electrode 61 contacts the drain electrode 59.

As described above, since the LDD regions 56 are formed between the source and the drain regions 51a and 51b, the off current of the drain generated during pixel operation is reduced. This result can be achieved also by forming the LDD regions as offset regions without impurities injected therein.

Furthermore, instead of having a sub-channel region for each of the source and drain regions, a sub-channel region may be formed only on one of the drain and source region sides of the channel region to effectively reduce the leakage current of the drain.

The thin film transistor according to the present invention is, preferably, manufactured according to the method illustrated in FIGS. 6A–6D. FIGS. 6A–6D show cross-sectional views taken along line V—V in FIG. 4 for explaining a method of manufacturing a thin film transistor of a liquid crystal display in accordance with the embodiments of the present invention.

Figure 6A:
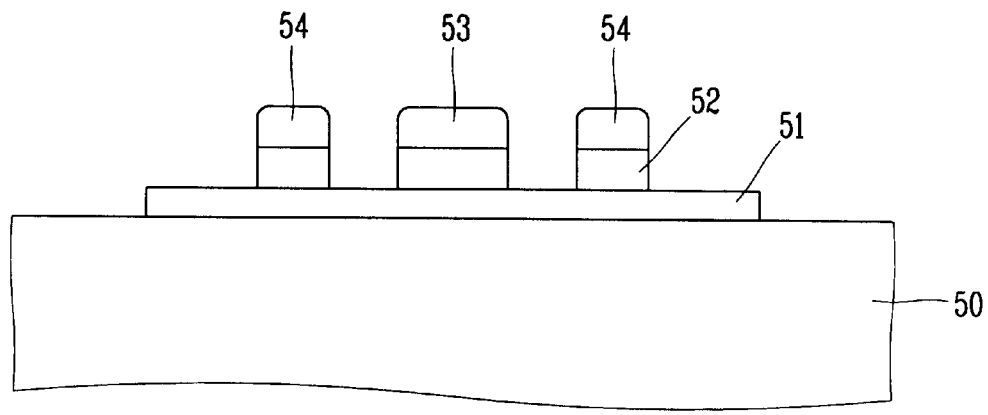
FIGS. 6A–6D show cross-sectional views taken along line V—V of FIG. 4 for illustrating a method of forming a thin film transistor of the LCD in accordance with the embodiments of the present invention.

As shown in FIG. 6A, polysilicon is deposited and patterned to form a semiconductor active layer 51 on an insulating substrate 50. On the semiconductor active layer 51 and the exposed substrate 50, a first insulating layer and a first conductive layer are sequentially formed. The first insulating layer is formed using silicon oxide or silicon nitride, and the first conductive layer is formed using a metal material or a conductive material including polysilicon doped with impurities. The first insulating layer and the first conductive layer are patterned according to a predetermined pattern to form a gate insulating layer 52, a gate electrode 53, and sub-gate electrodes 54. At the same time, the signal line 53', connected to the gate electrode 53, and the first storage capacitor electrode 54', connected to the sub-gate electrodes 54, are simultaneously patterned and formed (see FIG. 4).

Figure 6B:
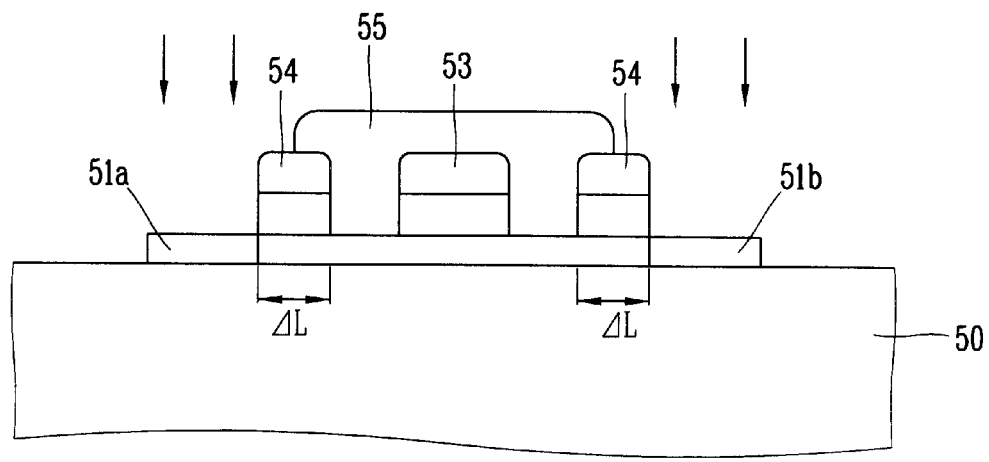

As shown in FIG. 6B, photoresist is coated over the insulating substrate 50, and patterned to form an ion injection or implantation mask 55. The mask 55 completely covers the portions of the semiconductor active layer 51 formed between the gate electrode 53 and the sub-gate electrodes 54, but partially exposes portions of the sub-gate electrodes 54. The position and patterning of the mask 55 is important to insure that high concentration ion implantation is safely and uniformly performed in the portions of the semiconductor active layer 51 except for between the gate electrode 53 and the sub-gate electrodes 54. That is, the mask 55 should be etched so that it partially covers an upper surface of the sub-gate electrodes 54 as shown in FIG. 6B. This provides marginal regions corresponding to a distance $\Delta L$ (width of sub-gate electrode) during the photoresist etching process. As a result, misalignment errors and over-etching up to a distance of $\Delta L$ can be tolerated without damaging the thin film transistor.

By using the mask 55, high concentration impurity ions are injected into the exposed semiconductor layer 51, which consequently forms the source region 51a and the drain region 51b. To smooth out the formed regions, a heat treatment or annealing process using a laser is performed. Thereafter, the mask 55 is completely removed.

Figure 6C:
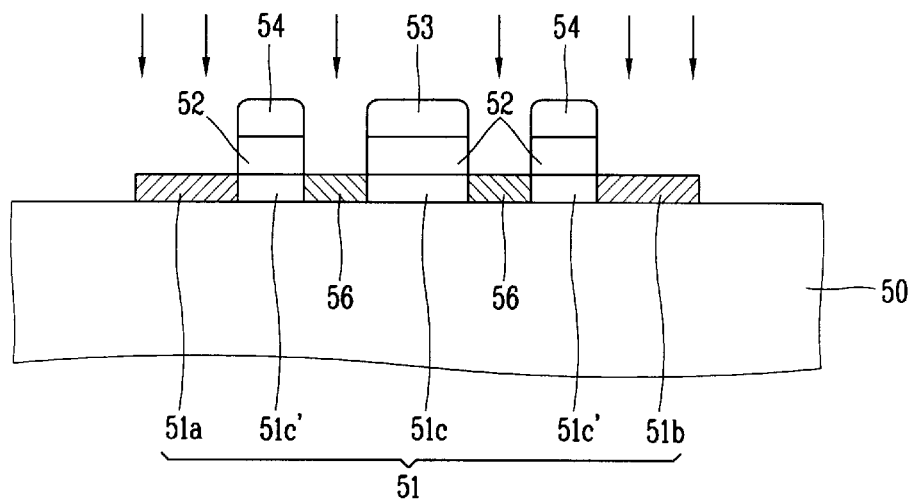

As shown in FIG. 6C, using the gate electrode 53 and the sub-gate electrodes 54 as a mask, conductive-type low concentration impurities, similar to the ions injected into the source and drain regions 51a and 51b, are injected into the semiconductor active layer 51. As a result, LDD regions 56 are formed between the gate electrode 53 and the sub-gate electrode 54. The semiconductor active layer 51 thus includes, in sequence, the source region 51a, the sub-channel region 51c', the LDD region 56, the channel region 51c, the LDD region 56, the sub-channel region 51c', and the drain region 51b.

In this example, although the LDD regions 56 made of low concentration impurities are formed in the semiconductor active layer 51, the low concentration impurity ion injection step as described in FIG. 6C can be eliminated so as to use the LDD regions 56 as offset regions. This is advantageous because the offset regions, like the LDD regions 56, reduce the drain's off current.

Additionally, although the high concentration impurity regions 51a and 51b were established before the LDD regions 56, it is possible to form the LDD regions 56 first and the high concentration impurity regions thereafter. For example, after carrying out the steps described referring to FIG. 6A, the low concentration ions can be injected into the semiconductor active layer 51 as shown in FIG. 6C. Then, as shown in FIG. 6B, the ion injection mask 55 is formed to completely cover the gate electrode 53 and partially cover the sub-gate electrodes 54, and high concentration ions are injected using the mask 55. By using this method, the source and drain regions 51a and 51b are formed in the semiconductor active layer 51, and the LDD regions 56 are subsequently formed between the gate electrode 53 and sub-gate electrodes 54 in the semiconductor active layer 51. The LDD regions 56 are protected from the high concentration impurity ion injection process and are uniformly established.

Figure 6D:
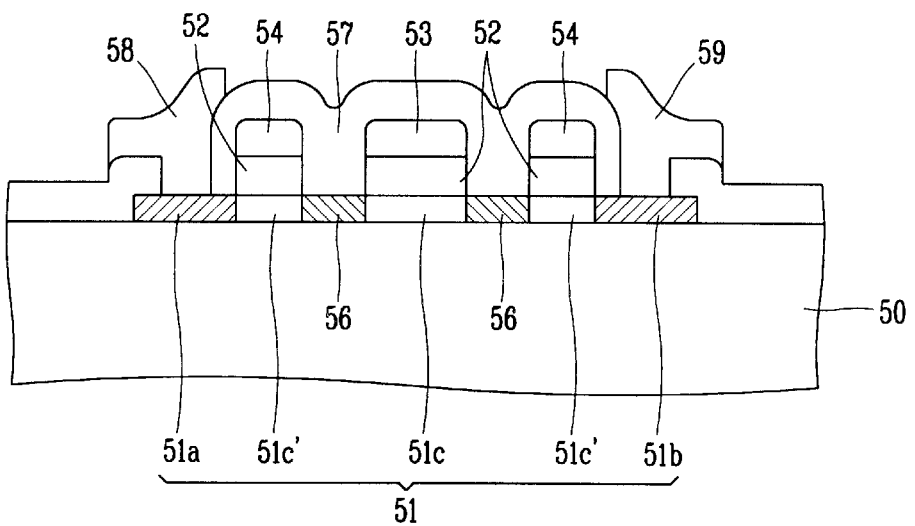

As shown in FIG. 6D, a second insulating layer, such as an oxide film, is deposited over the insulating substrate and patterned to form an insulating inter-layer 57. In the insulating inter-layer 57, contact holes are formed to expose portions of the source region 51a and the drain region 51b of the semiconductor active layer 51. On the insulating inter-layer 57 and in the contact holes, a second conductive material is deposited and patterned to form the source electrode 58 and the drain electrode 59. The source and drain electrodes 58 and 59 respectively contact the source and drain regions 51a and 51b through the contact holes.

As shown in FIG. 5, over the insulating inter-layer 57 and the drain and source electrodes 59 and 58, a third insulating layer is deposited and patterned to form the protective layer 60. Through the protective layer 60, a contact hole is formed through which the pixel electrode 61 contacts the drain electrode 59. Accordingly, the structure of the thin film transistor shown in FIG. 5 is obtained.

According to the embodiments of the present invention, any misalignment of the LDD regions due to inaccurate positioning of the ion injection mask can be reduced. Misalignment errors up to the amount of overlap between of the ion injection mask and the sub-gate electrodes can be tolerated. As a result, transistors having uniformly sized LDD regions can be provided for an active matrix liquid crystal display. The uniformly sized LDD regions allow picture quality uniformity and an increased contrast ratio, and eliminate the occurrence of the flicker phenomenon. Accordingly, the performance of the liquid crystal display is enhanced.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A thin film transistor, comprising:
   a first insulating layer;
   an active region formed on said first insulating layer, said active region including
      a channel region,
      a source region formed on a first side of said channel region,
      a drain region formed on a second side of said channel region, a first sub-channel region formed between said channel region and said source region, a second sub-channel region formed between said channel region and said drain region, a first intermediate region formed between and in direct contact with both said channel region and said first sub-channel region, and a second intermediate region formed between and in direct contact with both said channel region and said second sub-channel region;

a gate insulating layer formed on said channel region and said first and second sub-channel regions;

a gate electrode formed on said gate insulating layer over said channel region; and a first and a second sub-gate electrodes formed on said gate insulating layer over said first and second sub-channel regions respectively, wherein a conductive line connected to said first and second sub-gate electrodes forms a first electrode of a storage capacitor, and a pixel electrode electrically to said drain region of the thin film transistor forms a second electrode of said storage capacitor, and wherein at least one of said first and second sub-channel regions is in contact with one of said source region and said drain region, each of said source region and said drain region being heavily doped and having an edge aligned with one of said first and second sub-gate electrodes, said first and second intermediate regions being lightly doped and aligned with said channel region and said first and second sub-channel regions in a straight line.

2. The thin film transistor of claim 1, further comprising:

a second insulating layer defining a first and a second contact holes exposing a portion of said source region and said drain region, respectively;

a source electrode formed on a portion of said second insulating layer and in contact with said source region via said first contact hole;

a drain electrode formed on a portion of said second insulating layer and in contact with said drain region via said second contact hole;

a protective layer formed over said first insulating layer, said second insulating layer, said source electrode and said drain electrode, and defining a third contact hole exposing a portion of said drain electrode; and the pixel electrode formed on a portion of said protective layer and in contact with said drain electrode via said third contact hole.

3. The thin film transistor of claim 1, wherein said gate electrode and said first and second sub-gate electrodes are formed of a same conductive material.

4. The thin film transistor of claim 1, wherein said first insulating layer is an insulating substrate.

5. The thin film transistor of claim 1, wherein said active region is formed of polysilicon.

6. The thin film transistor of claim 1, said gate electrode is connected to a signal line.

7. The thin film transistor of claim 1, wherein said first sub-channel region is in contact with said source region, and said second sub-channel region is in contact with said drain region.

8. A thin film transistor, comprising:

a first insulating layer;

an active region formed on said first insulating layer, said active region including a channel region, a source region formed on a first side of said channel region, a drain region formed on a second side of said channel region, a first sub-channel region formed between said channel region and said source region, a second sub-channel region formed between said channel region and said drain region, a first intermediate region formed between and in direct contact with both said channel region and said first sub-channel region, and a second intermediate region formed between and in direct contact with both said channel region and said second sub-channel region;

a gate insulating layer formed on said channel region and said first and second sub-channel regions;

a gate electrode formed on and in alignment with said gate insulating layer over said channel region, said gate electrode being connected to a branch of a gate signal line; and a first and a second sub-gate electrodes formed on and in alignment with said gate insulating layer over said first and second sub-channel regions respectively, wherein at least one of said first and second sub-channel regions is in contact with one of said source region and said drain region, each of said source region and said drain region being heavily doped and having an edge aligned with one of said first and second sub-gate electrodes, said first and second intermediate regions being lightly doped and aligned with said channel region and said first and second sub-channel regions in a straight line, and wherein a conductive line connected to said first and second sub-gate electrodes forms a first electrode of a storage capacitor, and a pixel electrode electrically connected to the drain region of the thin film transistor forms a second electrode of said storage capacitor.

9. The thin film transistor of claim 8, wherein said first sub-channel region is in contact with said source region, and said second sub-channel region is in contact with said drain region.

* * * * *